(12) United States Patent
Chen et al.

(10) Patent No.: US 9,426,880 B2
(45) Date of Patent: Aug. 23, 2016

(54) NOISE SUPPRESSION ASSEMBLY AND ELECTRONIC DEVICE HAVING THE SAME

(71) Applicant: Wistron Corp., New Taipei (TW)

(72) Inventors: Chien-Ju Chen, New Taipei (TW); Po-Hsien Chu, New Taipei (TW); Chun-Hsiang Lei, New Taipei (TW); Yuan-Cheng Sun, New Taipei (TW)

(73) Assignee: WISTRON CORP., New Taipei (TW)

( * ) Notice: Subject to any disclaimer, the term of this patent is extended or adjusted under 35 U.S.C. 154(b) by 222 days.

(21) Appl. No.: 14/248,042

(22) Filed: Apr. 8, 2014

(65) Prior Publication Data
US 2015/0131243 A1 May 14, 2015

(30) Foreign Application Priority Data

Nov. 13, 2013 (TW) .............................. 102141348 A (51) Int. Cl.
| H05K 1/00 | (2006.01) |
|---|---|
| H05K 1/18 | (2006.01) |
| H05K 7/00 | (2006.01) |
| H05K 1/02 | (2006.01) |
| H05K 3/34 | (2006.01) |
| H05K 7/20 | (2006.01) |

(52) U.S. Cl.
CPC ............ *H05K 1/0216* (2013.01); *H05K 1/0243* (2013.01); *H05K 3/3447* (2013.01); *H05K 7/20009* (2013.01); *H05K 2201/09163* (2013.01); *H05K 2201/10446* (2013.01)

(58) Field of Classification Search
CPC .............. H05K 1/0216; H05K 1/0243; H05K 2201/09163; H05K 2201/10446; H05K 3/3447; H05K 7/20009

USPC .......... 361/760, 748, 752, 785, 766; 439/607, 439/567, 609, 79, 610
See application file for complete search history.

(56) References Cited

U.S. PATENT DOCUMENTS

| 4,858,071 A * | 8/1989 | Manabe ................. H05K 1/189 361/711 |
| 6,293,818 B1 * | 9/2001 | Kim ....................... H01R 12/79 439/495 |

(Continued)

FOREIGN PATENT DOCUMENTS

| CN | 201230051 Y | 4/2009 |
| TW | M401972 | 4/2011 |
| TW | M401972 U1 | 4/2011 |

OTHER PUBLICATIONS

Chinese Office Action for corresponding application No. 201306375054, mailed Jun. 1, 2016.

*Primary Examiner* — Yuriy Semenenko
(74) *Attorney, Agent, or Firm* — Maschoff Brennan (57) ABSTRACT

An electronic device includes a circuit board, a connector and a noise suppression assembly. The circuit board includes a substrate having a surface layer. The connector is disposed on the circuit board and has at least one electrical pin. The noise suppression assembly includes a wiring area located on the surface layer and adjacent to the connector and a conductive cover member. The wiring area includes at least one electrical contact, a transmission circuit and at least one ground contact, the electrical contact is used for being in electrical contact with the electrical pin of the connector. The transmission circuit is electrically connected to the electrical contact. The ground contact is located around the wiring area. The conductive cover member has a cover plate and at least one lateral plate. The lateral plate is connected to the cover plate for forming a shielded space.

15 Claims, 7 Drawing Sheets

(56) References Cited

U.S. PATENT DOCUMENTS

| | | | |
|---|---|---|---|
| 7,018,237 B2 * | 3/2006 | Zhan | H01R 13/65802 439/567 |
| 7,517,249 B1 * | 4/2009 | Zhang | H01R 13/65802 439/607.01 |
| 7,686,646 B2 * | 3/2010 | Lee | H01R 12/7047 439/567 |
| 2006/0084319 A1 * | 4/2006 | Chang | H01R 13/65802 439/607.37 |
| 2010/0157544 A1 | 6/2010 | Tsao | |
| 2012/0040538 A1 * | 2/2012 | Vrenna | H01R 12/58 439/55 |

* cited by examiner

NOISE SUPPRESSION ASSEMBLY AND ELECTRONIC DEVICE HAVING THE SAME

CROSS-REFERENCE TO RELATED APPLICATIONS

This non-provisional application claims priority under 35 U.S.C. §119(a) on Patent Application No(s). 102141348 filed in Taiwan, R.O.C. on Nov. 13, 2013, the entire contents of which are hereby incorporated by reference.

TECHNICAL FIELD

The disclosure relates to a noise suppression assembly, more particularly to a noise suppression assembly having a metal cover member capable of shielding and releasing the electromagnetic noise generated by the high-speed transmission interface, for improving the wireless communication quality, and an electronic device having the noise suppression assembly.

BACKGROUND

As demands for more digital information and bigger data size grow considerably, the related industries have been trying to develop better transmission quality and better real-time computing. These demands promote the development of the high-speed signal transmission technology. In addition to changing signal codes, reducing signal level and providing full-duplex transmission mode can also increase signal transmission speed and reduce users' time for waiting. In this method, stringent standards regarding signal attenuation and distortion as well as noise interference are applied. Hence, quality and speed of the signal transmission of the connector is crucial. USB 2.0 connectors have been introduced in the year of 2000 and its maximum transmission speed is 480 Mbps. In 2008, a full-duplex USB 3.0 connectors have been introduced and its maximum transmission speed is 4.8 Gbps which is ten times the speed of the USB 2.0 connectors. Apart from the advantage of the transmission speed, USB 3.0 connectors are capable of backward compatibility so that USB 3.0 connectors are widely used in the electronic devices.

However, high-speed signal transmission comes with the high-frequency and high-energy electromagnetic signals. These electromagnetic signals result in delay, disconnection and bad transmission quality of the wireless devices around the electronic device (e.g., wireless keyboards, mouses, 802.11b/g/n and Bluetooth). Therefore, it is crucial to suppress electromagnetic interference (EMI) and electromagnetic compatibility (EMC).

SUMMARY

An electronic device comprises a circuit board, a connector and a noise suppression assembly. The circuit board comprises a substrate having a surface layer. The connector is disposed on the circuit board and has at least one electrical pin. The noise suppression assembly comprises a wiring area is located on the surface layer and adjacent to the connector and a conductive cover member. The wiring area comprises at least one electrical contact, a transmission circuit and at least one ground contact, the at least one electrical contact is configured to be in electrical contact with the at least one electrical pin of the connector. The transmission circuit is electrically connected to the at least one electrical contact. The at least one ground contact is located around the wiring area. The conductive cover member has a cover plate and at least one lateral plate. The at least one lateral plate is connected to the cover plate for forming a shielded space, while the at least one lateral plate is electrically connected to and in contact with the at least one ground contact, so that both the at least one electrical contact inside the wiring area and the transmission circuit are covered and shielded by the conductive cover member in the shield space.

A noise suppression assembly for an electronic device having a circuit board and a connector installed on the circuit board comprises a wiring area and a conductive cover member. The wiring area is located on the surface layer and adjacent to the connector and comprises at least one electrical contact, a transmission circuit and at least one ground contact. The at least one electrical contact is configured to be in electrical contact with the at least one electrical pin of the connector. The transmission circuit is electrically connected to the at least one electrical contact. The at least one ground contact is located around the wiring area. The conductive cover member has a cover plate and at least one lateral plate. The at least one lateral plate is connected to the cover plate for forming a shielded space, while the at least one lateral plate is electrically connected to and in contact with the at least one ground contact, so that both the at least one electrical contact inside the wiring area and the transmission circuit are covered and shielded by the conductive cover member in the shield space.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
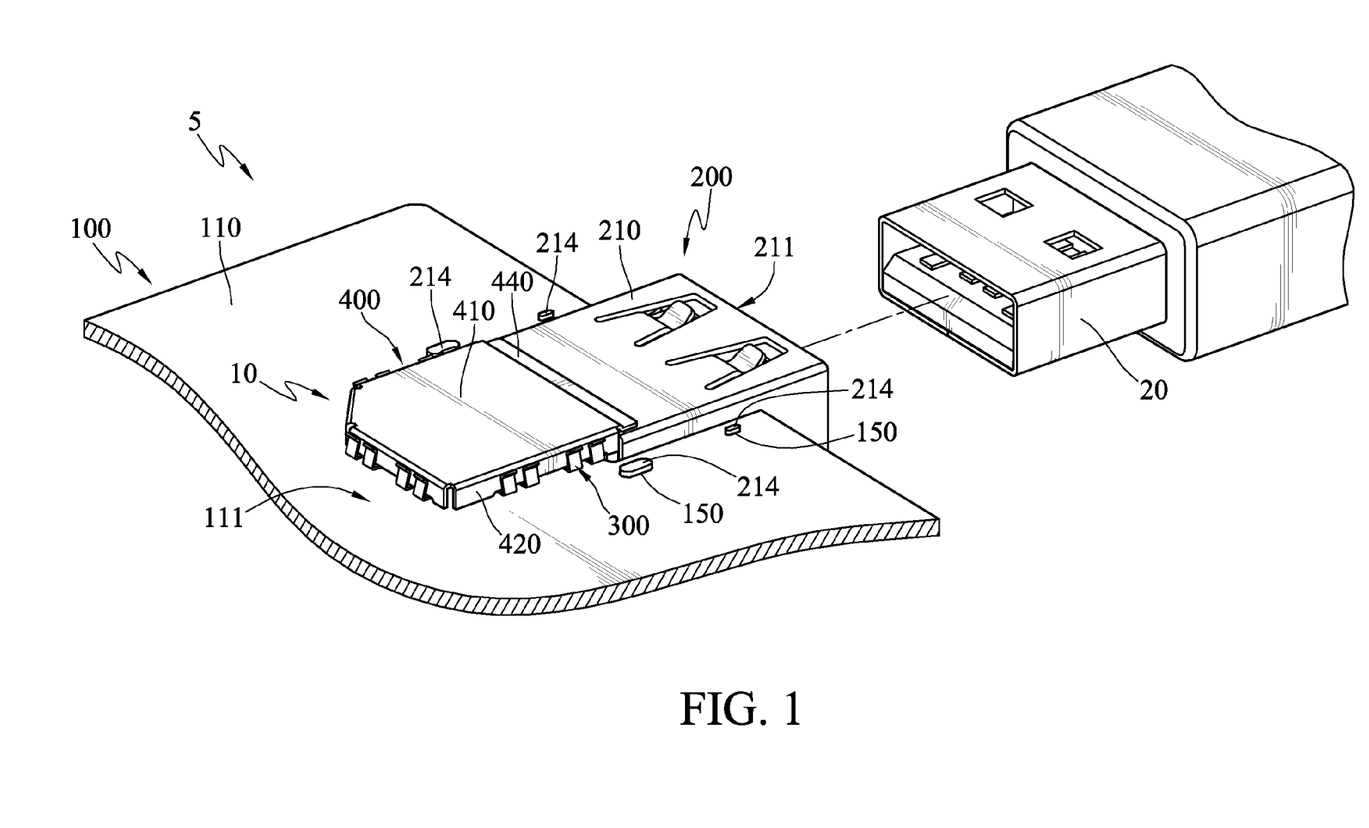
FIG. 1 is a perspective view of a noise suppression assembly and an electrical plug according to the first embodiment of the disclosure.
Figure 2:
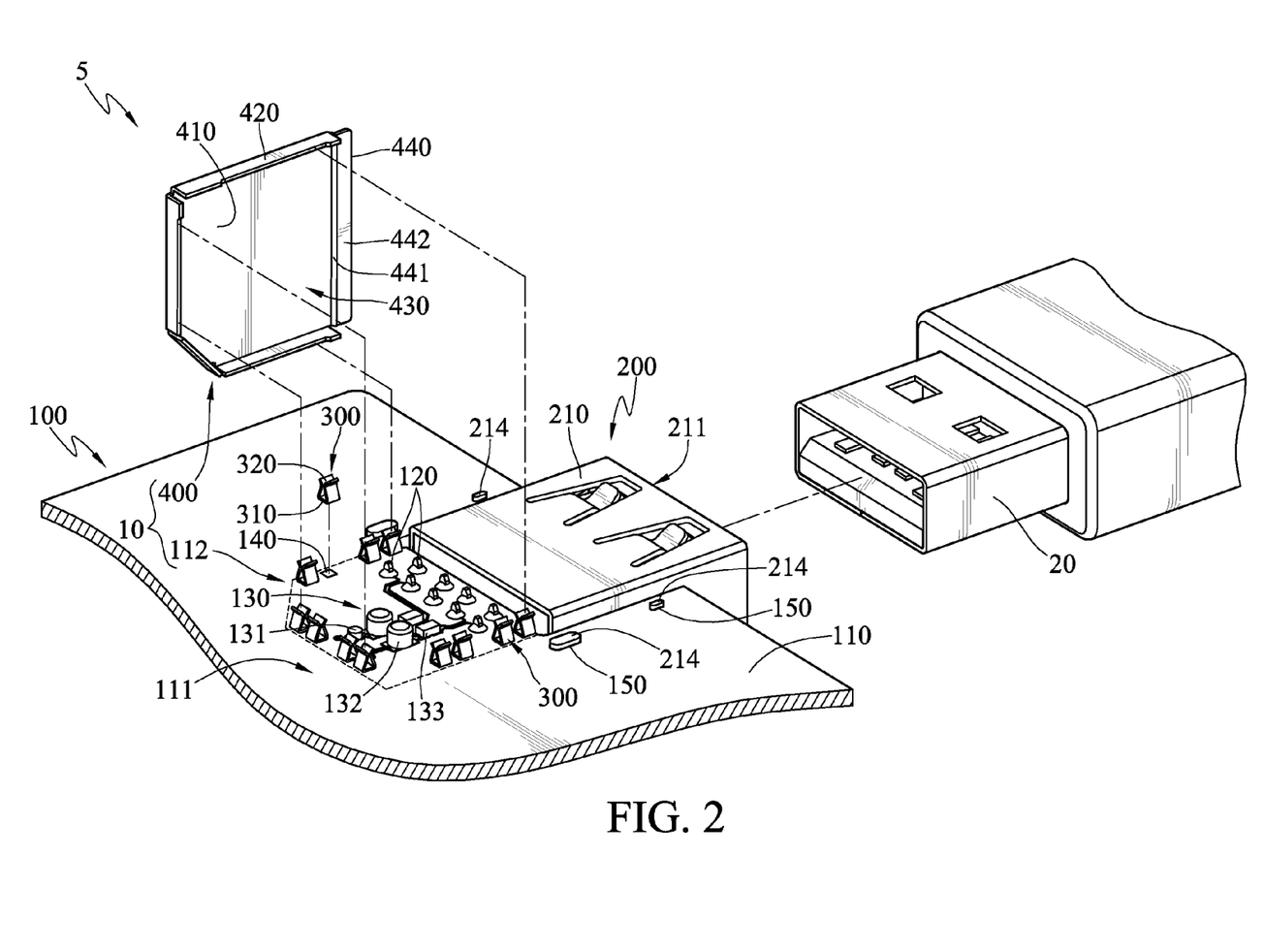
FIG. 2 is an exploded view of FIG. 1.
Figure 3:
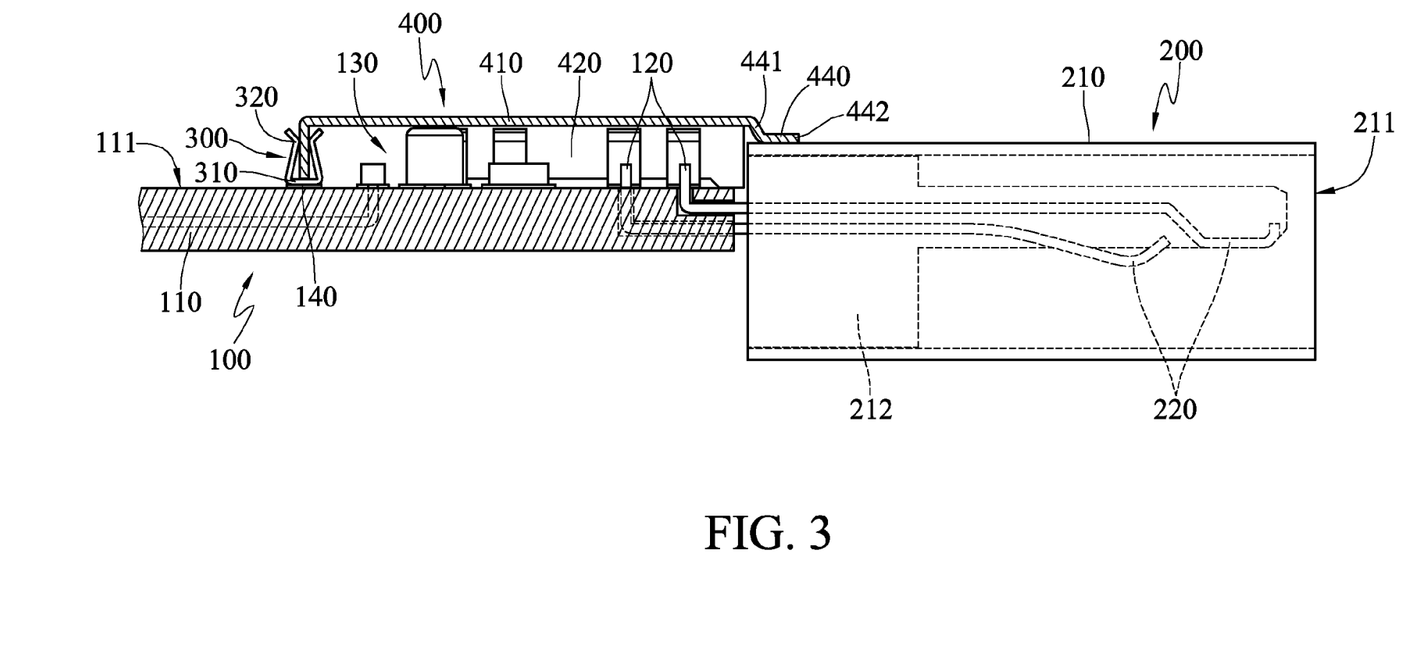
FIG. 3 is a sectional view of the noise suppression assembly of FIG. 1.

FIG. 1 is a perspective view of a noise suppression assembly and an electrical connector according to the first embodiment of the disclosure; FIG. 2 is an exploded view of FIG. 1; FIG. 3 is a sectional view of the noise suppression assembly of FIG. 1. As seen in FIG. 1 to FIG. 3, in this embodiment, an electronic device 5 comprises a circuit board 100, an electrical connector 200 and a noise suppression assembly 10. The noise suppression assembly 10 comprises a wiring area 112, a plurality of the conductive holding members 300 and a conductive cover member 400.

The circuit board 100 comprises a substrate 110. The substrate 110 may be made of insulating layers, wiring layers and ground layers stacked up together. The substrate 110 has a surface layer 111 and a plurality of the ground portions 150.

The wiring area 112 comprises a plurality of the electrical contacts 120, a transmission circuit 130 and a plurality of the ground contacts 140. The electrical contacts 120, the transmission circuit 130 and the ground contacts 140 are all disposed on the surface layer 111 and are all inside the wiring area 112. The transmission circuit 130 comprises, for example, a plurality of bare wires, two common chocks 132, two static electricity protection circuits 133 and a capacitance 131. The bare wires are connected to the electrical contacts 120, respectively. One of the common chocks 132, one of the static electricity protection circuits 133 and the capacitance 131 are connected in series and are all electrically connected to a part of bare wires. The other common chocks 132 and the other static electricity protection circuits 133 are connected in series and are electrically connected to the other part of the bare wires. These transmission circuits 130 are used for transmitting signals. Additionally, with components such as the static electricity protection circuits 133 and the common chocks 132, the transmission circuits 130 are also capable of preventing electronic components, which are connected to the electrical contacts 120, from electrostatic interference. These ground contacts 140 are located around the wiring area 112, while the ground contacts 140 is disposed on the surface layer 111 of the substrate 110.

Nonetheless, the arrangement of the aforementioned transmission circuit 130 is merely an example and the disclosure is not limited thereto. In other embodiments, the transmission circuit 130 is selected from a group consisting of a bare wire, a common choke, an electrostatic protection circuit, a bead, an inductor, a resistor, a capacitor, and combinations thereof. Specifically, the transmission circuit 130 is a signal processing element matches USB 3.0 connectors. Since the transmission circuit 130 is selected from a group consisting of the bare wire, the common choke, the electrostatic protection circuit, the bead, the inductor, the resistor, the capacitor, and combinations thereof, it is disposed on the surface layer 111 of the circuit board 100 near the rear side of the electrical connector 200, namely inside the wiring area 112 of the disclosure. After being processed by these signal processing components, the transmission line penetrates and goes to the inner layer of the circuit board 100 via a blind hole. Compared to the transmission line passing through the inner layer and covered by the ground layer, the transmission circuit 130 is exposed by one the surface layer 111 of the circuit board 100. Thereby, it generates more significant electromagnetic noise which needs to be addressed.

The electrical connector 200 is disposed on one side of the substrate 110 and is used for being plugged in by an electrical plug 20. The wiring area 112 is located in a rear position adjacent to the electrical connector 200, so that the electrical connector 200 and the ground contacts 140 together surround the wiring area 112. The electrical connector 200 comprises a conductive shell 210, an insulating base 212, a plurality of the ground pins 214 and a plurality of the electrical pins 220. The conductive shell 210 is made of, for example, metal material and is bent to form a slot 211. The conductive shell 210 is fixed to the ground portions 150 electrically connected to the circuit board 100 through being welded with the ground pins 214. One end of each of the electrical pins 220 is located in the insulating base 212 inside the slot 211, while the other end is electrically connected to each of the electrical contacts 120 inside the wiring area 112.

In this embodiment, the electrical connector 200 is a USB 3.0 slot, but it is not limited thereto. In other embodiments, the electrical connector 200 may be high-speed transmission interfaces such as Digital Visual Interface (DVI) or High-Definition Multimedia Interface (HDMI).

These conductive holding members 300 are made of, for example, conductive metal material. Moreover, the conductive holding member 300 comprises an adhesive section 310 and two clamping sections 320. The adhesive section 310 is fixed to and is electrically connected to the ground contacts 140 by welding or surface mount technology (SMT), so that the conductive holding members 300 and the ground contacts 140 are fixed to and are in electrical contact with the circuit board 100. The two clamping sections 320 respectively extend from the adhesive section 310 towards the same side. The two clamping sections 320 are flexible and normally tend to move closer to each other.

The conductive cover member 400 has a plurality of the lateral plates 420 and a cover plate 410 made of, for example, conductive metal material. The lateral plates 420 surround the cover plate 410 for forming a shielding space 430 which is not necessarily a continuous and closed structure. The lateral plates 420 are disposed between the two clamping sections 320 in a detachable manner, and are electrically connected to each of the ground contacts 140 by the conductive holding members 300. When the conductive cover member 400 is fixed to all of the conductive holding members 300, the transmission circuit 130, which is exposed, on the surface layer 111 of the substrate 110 can be covered and shielded by the conductive cover member 400 in the shielding space 430. Specifically, when high-speed signals pass through, the transmission circuit 130, which is exposed, on the surface layer 111 of the substrate 110 generates electromagnetic noise. The conductive cover member 400 of this embodiment, meanwhile, may block the electromagnetic noise generated by the transmission circuit 130 and may release the electromagnetic noise via conductive holding members 300. This can effectively prevent the transmission quality of the wireless equipments from decreasing by the electromagnetic noise.

Furthermore, the conductive cover member 400 further comprises a conductive plate 440 having a first end 441 and a second end 442 opposite to each other. The first end 441 of the conductive plate 230 is connected to the cover plate 410, while the second end 442 may lap over the end of the conductive shell 210 of the electrical connector 200 for maintaining the electrical contact. Thereby, noise (e.g., static electricity) on the conductive shell 210 of the electrical connector 200 may be released not only by the ground pins 214 and the ground portions 150, but also by the ground contacts 140 via the conductive cover member 400, thereby suppressing the electromagnetic noise generated during the signal transmission. Moreover, the electromagnetic noise of the transmission circuit 130 inside the wiring area 112 can be released not only by grounding via conductive holding members 300, but also by the ground pins 214 and the ground portions 150 because the conductive cover member 400 is electrically connected to the electrical connector 200. Hence, the electromagnetic noise can be guided out quickly.

Figure 4:
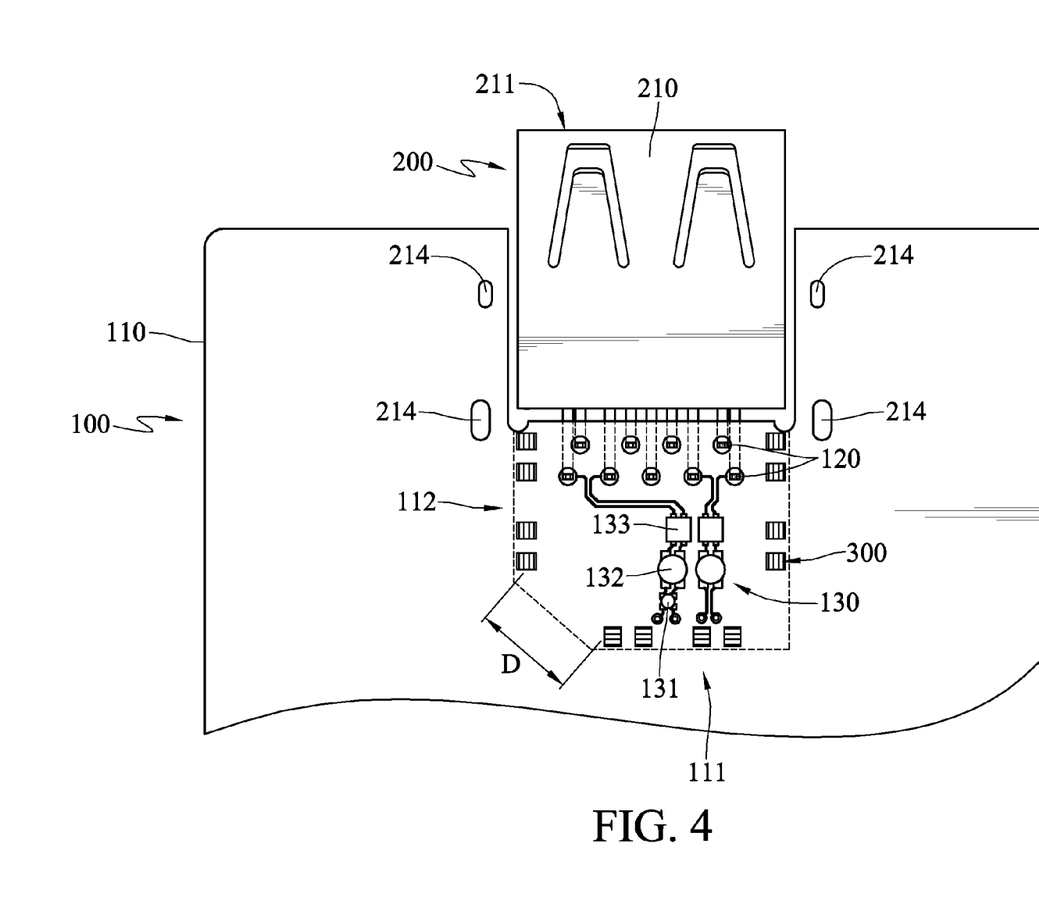
FIG. 4 is a top view of the noise suppression assembly of FIG. 1.
Figure 5:
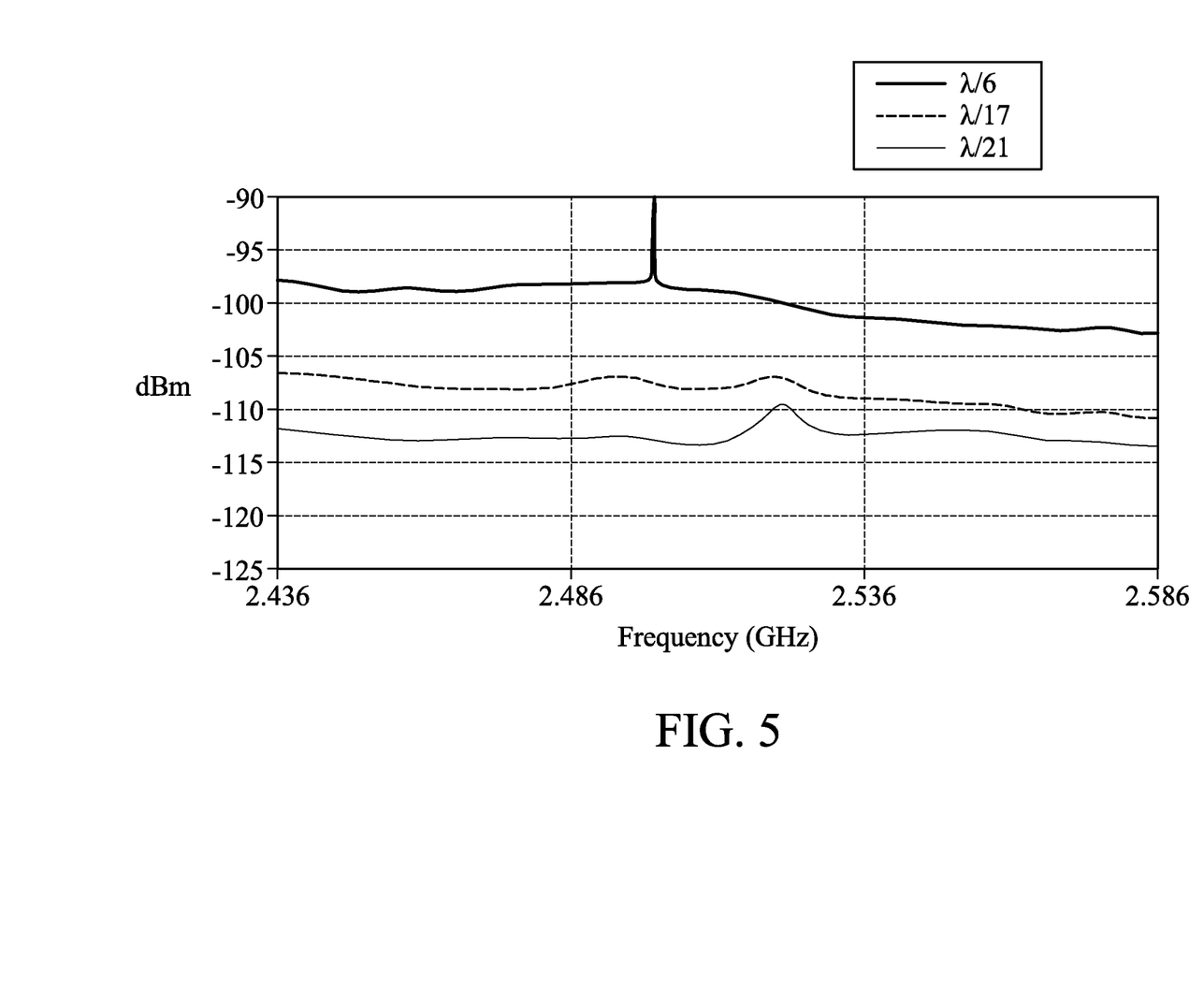
FIG. 5 is a schematic graph of a noise simulation of the noise suppression assembly of FIG. 1.

FIG. 4 is a top view of the noise suppression assembly of FIG. 1; FIG. 5 is a schematic graph of the noise simulation of the noise suppression assembly of FIG. 1. As seen in FIG. 4 and FIG. 5, the conductive cover member 400 is fixed to the conductive holding members 300 but the lateral plates 420 does not necessarily push against the surface layer 111 of the substrate 110 tightly. In other words, noise generated by the transmission circuit 130 may leak through the gap between the lateral plates 420 and the surface layer 111, thereby making the transmission quality of the peripheral wireless devices worse. Thus, in this embodiment, the gaps between the conductive holding members 300 are determined to reducing the leakage of the noise. Based on the wavelength formula: c/f (wherein c is light speed and f is frequency), it is known that, for example, the wavelength of a Wi-Fi wireless device with a 5 Ghz frequency is 60 mm. Theoretically, one tenth of the wavelength still has electromagnetic wave resonances. In the simulations, however, one seventeenth of the wavelength to one twenty-first of the wavelength can have better noise suppression effects (as shown in FIG. 5). Consequently, the maximum distance between adjacent two conductive holding members 300 should from 113 mils to 140 mils. In this embodiment, the distance between adjacent two conductive holding members 300 is not greater than 140 mils.

Figure 6:
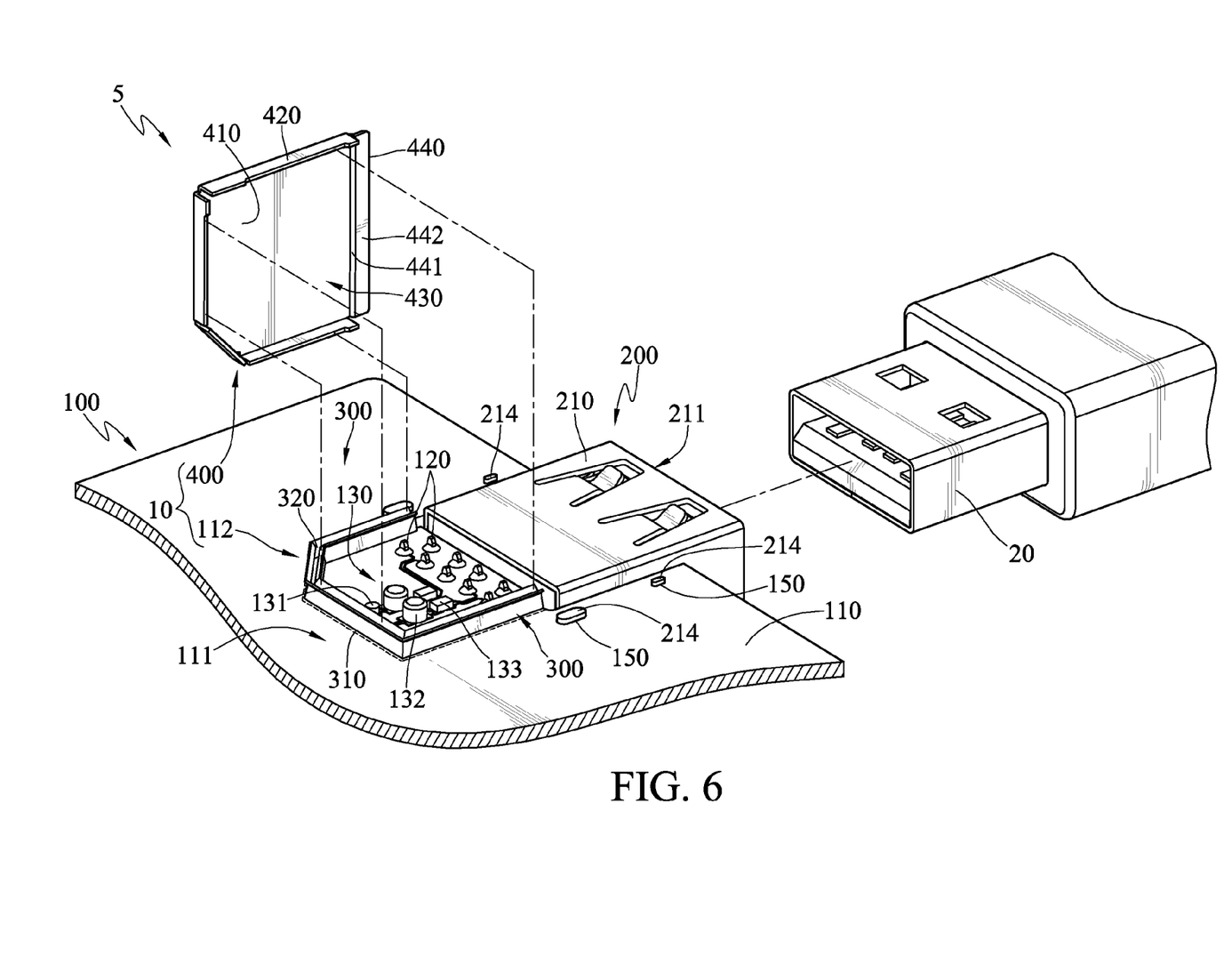
FIG. 6 is an exploded view of a noise suppression assembly and an electrical plug according to the second embodiment of the disclosure.

FIG. 6 is ax exploded view of a noise suppression assembly and an electrical connector according to the second embodiment of the disclosure. This embodiment is similar to the embodiment of FIG. 1, so only the differences will be illustrated. As seen in FIG. 6, in this embodiment, the number of the conductive holding members 300 is one. The conductive holding member 300 comprises an adhesive section 310 and two clamping sections 320. The adhesive section 310 bends, extends and is welded to these ground contacts 140. The adhesive section 310 and the electrical connector 200 together surround the wiring area 112. The two clamping sections 320 are connected to the curved peripheral edge of the adhesive section 310 and extend along the adhesive section 310. The lateral plates 420 are fastened between the two clamping sections 320 in a detachable manner. In this embodiment, the conductive holding member 300 is an annular and closed structure so the gap between adjacent conductive holding members is not an issue here.

Figure 7:
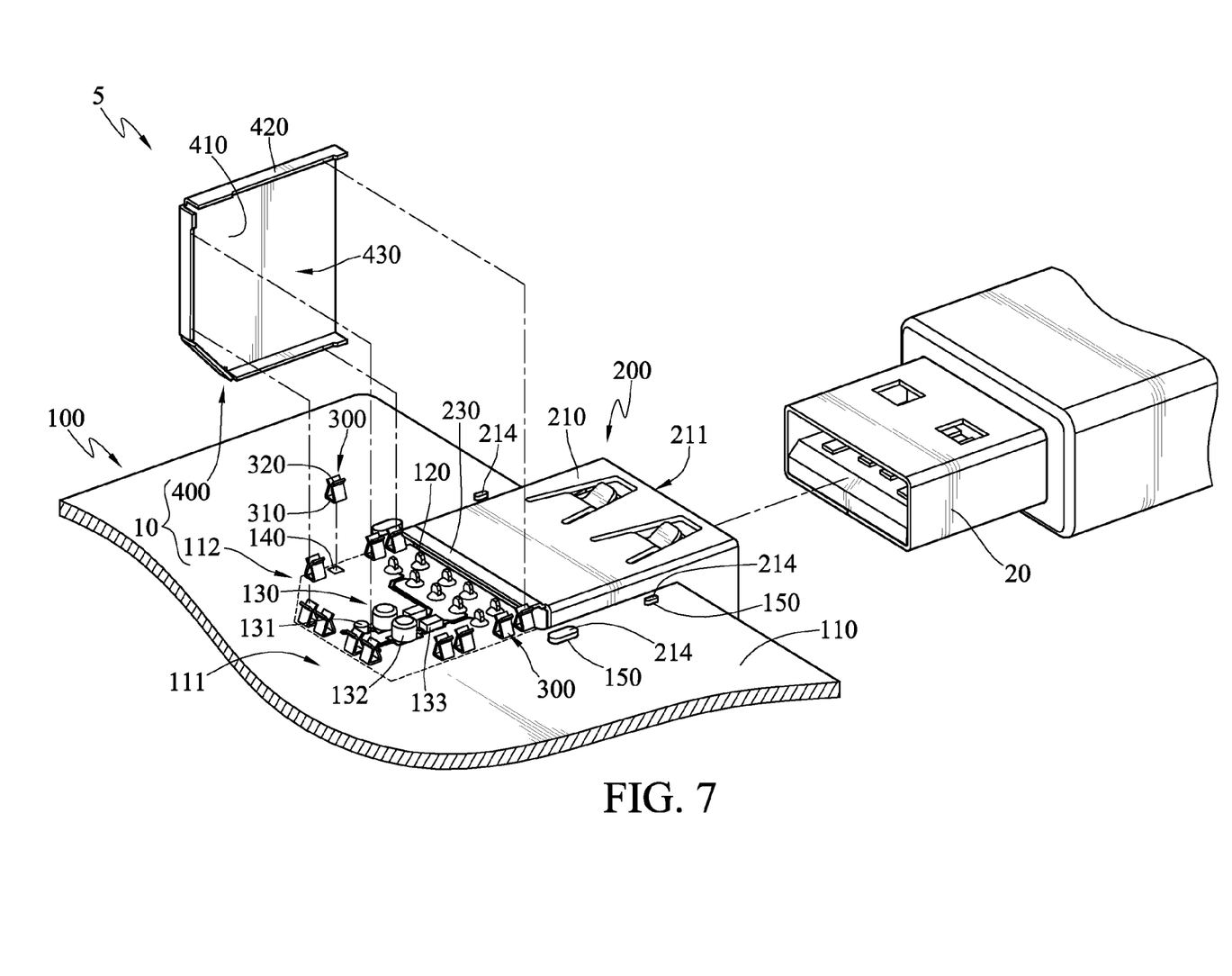
FIG. 7 is an exploded view of a noise suppression assembly and an electrical plug according to the third embodiment of the disclosure.

FIG. 7 is an exploded view of a noise suppression assembly and an electrical connector according to the third embodiment of the disclosure. This embodiment is similar to the embodiment of FIG. 1, so only the differences will be illustrated. As seen in FIG. 7, in this embodiment, the electrical connector 200 further comprises a conductive plate 230. One side of the conductive plate 230 is connected to the case, while the other side is lapped over by and is electrically connected to the end of the cover plate 410 of the conductive cover member 400. In other words, the position of the conductive plate 230 changes from being on the conductive cover member 400 shown in FIG. 1 to be on the conductive shell 210 of the electrical connector 200 as illustrated in this embodiment.

In above-mentioned embodiments, the conductive holding member 300 comprises two clamping sections 320, but the disclosure is not limited thereto. In other embodiments, the conductive holding member 300 may only comprise one clamping section. That is, it only comprises the outer structure of the two clamping sections 320. The structure of the conductive holding members 300 can be other forms, as long as it is electrically connected to the ground contacts 140 and it can secure the conductive cover member 400 for shielding.

In the noise suppression assembly of the disclosure, the transmission circuit, which is exposed, on the surface layer of the substrate is covered in the shielding space of the conductive cover member and the ground path is added. Thereby, the electromagnetic noise generated by does not radiate out. Additionally, the electromagnetic noise can be guided to each ground contact for suppressing the noise, thereby improving the transmission quality.

Moreover, the distance between adjacent conductive holding members is not greater than 140 mils. This reduces the leakage of the noise of the transmission circuit which passed through the gap between the conductive cover member and the substrate so the transmission quality of the wireless devices around is improved.

What is claimed is:

1. An electronic device for transmitting and receiving a signal with a wavelength of a Wi-Fi wireless device, comprising:
   a circuit board comprising a substrate having a surface layer;
   a connector disposed on the circuit board and having at least one electrical pin; and
   a noise suppression assembly comprising:
      a wiring area located on the surface layer and adjacent to the connector, comprising at least one electrical contact, a transmission circuit and at least one ground contact, wherein the at least one electrical contact is configured to be in electrical contact with the at least one electrical pin of the connector, the transmission circuit is electrically connected to the at least one electrical contact, and the at least one ground contact is configured to surround the wiring area;
      a conductive cover member having a cover plate and at least one lateral plate connected to the cover plate to form a shielded space, wherein the at least one lateral plate is electrically connected to and in contact with the at least one ground contact, so that both the at least one electrical contact inside the wiring area and the transmission circuit are covered and shielded by the conductive cover member in the shield space; and
      a plurality of conductive holding members fixed to and in electrical contact with the ground contact, wherein the at least one lateral plate is clamped by the conductive holding members in a detachable manner;
      wherein, the distance between the conductive holding members adjacent to each other is not greater than one seventeenth of the wavelength.

2. The electronic device according to claim 1, wherein the at least one conductive holding member comprises an adhesive section and at least one clamping section, the adhesive section is fixed to and is electrically connected to the at least one ground contact, the at least one clamping section extends from the adhesive section and is flexible, and the at least one lateral plate is clamped by the clamping section in a detachable manner and is electrically connected together.

3. The electronic device according to claim 2, wherein the conductive holding member comprises two clamping sections, the two clamping sections extend, from opposite two sides of the adhesive section respectively, towards the same side while extending closer to each other, so that the at least one lateral plate is configured to be clamped between the two clamping sections and being electrically connected to the two clamping sections.

4. The electronic device according to claim 1, wherein the connector further comprises a conductive shell and an insulating base inside the conductive shell, and the connector has a slot, and wherein one end of the electrical pin is located on the insulating base while the other end is electrically connected to the at least one electrical contact.

5. The electronic device according to claim 1, wherein the connector further comprises a conductive shell, the conductive cover member further comprises a conductive plate, and wherein one side of the conductive plate is connected to the cover plate while the other side laps over and is in electrical contact with the conductive shell.

6. The electronic device according to claim 5, wherein the circuit board further comprises at least one ground portion, and the conductive shell is fixed to and is electrically connected to the ground portion via at least one ground pin.

7. The electronic device according to claim 5, wherein the conductive plate has a first end and a second end opposite to each other, the first end is connected to the cover plate, while the second end laps over and is in electrical contact with the conductive shell.

8. The electronic device according to claim 1, wherein the transmission circuit is selected from a group consisting of a bare wire, a common choke, an electrostatic protection circuit, a bead, an inductor, a resistor or a capacitor, and combinations thereof.

9. The electronic device according to claim 1, wherein the connector further comprises a conductive shell and a conductive plate, one side of the conductive plate is connected to the conductive shell, while the other side is lapped over by and is in electrical contact with the conductive cover member.

10. The electronic device according to claim 9, wherein the circuit board comprises at least one ground portion, and the conductive shell is fixed to the ground portion via at least one ground pin.

11. A noise suppression assembly, for an electronic device for transmitting and receiving a signal with a wavelength of a Wi-Fi wireless device, and the electronic device having a circuit board and a connector installed on the circuit board, the noise suppression assembly comprising:
   a wiring area located on surface layer of the circuit board and adjacent to the connector, wherein the wiring area comprises at least one electrical contact, a transmission circuit and at least one ground contact, the at least one electrical contact is configured to be in electrical contact with the at least one electrical pin of the connector, the transmission circuit is electrically connected to the at least one electrical contact, and the at least one ground contact is configured to surround the wiring area;
   a conductive cover member having a cover plate and at least one lateral plate, wherein the at least one lateral plate is connected to the cover plate to form a shielded space, the at least one lateral plate is electrically connected to and in contact with the at least one ground contact, so that both the at least one electrical contact inside the wiring area and the transmission circuit are covered and shielded by the conductive cover member in the shield space; and
   a plurality of conductive holding members fixed to and in electrical contact with the ground contact, wherein the at least one lateral plate is clamped by the conductive holding members in a detachable manner;
   wherein, the distance between the conductive holding members adjacent to each other is not greater than one seventeenth of the wavelength.

12. The noise suppression assembly according to claim 11, wherein the at least one conductive holding member comprises an adhesive section and at least one clamping section, the adhesive section is fixed to and is electrically connected to the at least one ground contact, the at least one clamping section extends from the adhesive section and is flexible, and the at least one lateral plate is clamped by the clamping section in a detachable manner and is electrically connected together.

13. The noise suppression assembly according to claim 12, wherein the conductive holding member comprises two clamping sections, the two clamping sections extend, from opposite two sides of the adhesive section respectively, towards the same side while extending closer to each other, so that the at least one lateral plate is configured to be clamped between the two clamping sections and being electrically connected to the two clamping sections.

14. The noise suppression assembly according to claim 11, wherein the conductive cover member further comprises a conductive plate, and one side of the conductive plate is connected to the cover plate while the other side laps over and is in electrical contact with the conductive shell.

15. The noise suppression assembly according to claim 11, wherein the transmission circuit is selected from a group consisting of a bare wire, a common choke, an electrostatic protection circuit, a bead, an inductor, a resistor or a capacitor, and combinations thereof.

* * * * *